(12) United States Patent
Nakanishi et al.

(10) Patent No.: US 7,439,823 B2
(45) Date of Patent: Oct. 21, 2008

(54) ELECTROMECHANICAL FILTER

(75) Inventors: Yoshito Nakanishi, Tokyo (JP);
Kunihiko Nakamura, Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 162 days.

(21) Appl. No.: 11/569,501

(22) PCT Filed: Jun. 2, 2005

(86) PCT No.: PCT/JP2005/010156

§ 371 (c)(1),
(2), (4) Date: Nov. 22, 2006

(87) PCT Pub. No.: WO2006/001162

PCT Pub. Date: Jan. 5, 2006

(65) Prior Publication Data

US 2007/0216496 A1      Sep. 20, 2007

(30) Foreign Application Priority Data

Jun. 25, 2004   (JP) .............................. 2004-187951

(51) Int. Cl.
*H03H 9/00* (2006.01)
*H03H 9/24* (2006.01)
*H01P 7/04* (2006.01)
*B82B 1/00* (2006.01)
*B81B 3/00* (2006.01)

(52) U.S. Cl. .................. 333/186; 333/197; 333/222; 977/724; 977/932

(58) Field of Classification Search ................. 333/185, 333/186, 187, 197, 198, 219, 222, 223; 977/742, 977/743, 752, 932, 956, 724
See application file for complete search history.

(56) References Cited

U.S. PATENT DOCUMENTS

| 5,172,085 | A | * | 12/1992 | Glenat et al. | ................. 333/222 |
| 6,894,586 | B2 | * | 5/2005 | Bircumshaw et al. | ....... 333/133 |
| 7,263,392 | B2 | * | 8/2007 | Akasegawa et al. | ......... 505/210 |

OTHER PUBLICATIONS

Bannon III et al., "High-Q HF Microelectromechanical Filters", IEEE Journal of Solid-State Circuits, vol. 35. No. 4, Apr. 2000.
Zheng et al., "Multiwalled Carbon Nanotubes as Gigahertz Oscillators", Physical Review Letters, vol. 88, No. 4, The American Physical Society, Jan. 28, 2002.

* cited by examiner

*Primary Examiner*—Dean O Takaoka
(74) *Attorney, Agent, or Firm*—Pearne & Gordon LLP (57) ABSTRACT

An object is to provide an electromechanical filter which can define a vibration mode so that a vibrator can be excited only in a desired vibration mode, that is, a filter which can suppress any vibration mode other than a desired vibration mode. The electromechanical filter includes a first member for inputting a signal, a second member disposed at a predetermined distance from the first member so as to surround the first member and to be excited due to an electrostatic force caused by the signal input from the first member, and a third member disposed at a predetermined distance from the second member so as to surround the second member and to detect vibration of the second member. The second member is designed to receive an attractive force from the first member and the third member so as to be bound and regulated as to a vibration direction.

14 Claims, 11 Drawing Sheets

SECTIONAL VIEW TAKEN ON LINE A-A'

FIG. 14 (a)

SECTIONAL VIEW TAKEN ON LINE B-B'

ELECTROMECHANICAL FILTER

TECHNICAL FIELD

The present invention relates to an electromechanical filter, and particularly relates to an electromechanical filter having a micro-vibrator.

BACKGROUND ART

In order to make wireless terminals smaller in size, it is desired to miniaturize passive devices such as filters occupying large areas in wireless portions. To this end, electromechanical filters using mechanical resonance have been proposed in place of conventional filters using electric resonance.

The size of a conventional filter using electric resonance depends on the electric length of its resonance frequency. Accordingly, there is a limit in dramatic miniaturization thereof. On the other hand, the size of a filter using mechanical resonance depends on the mass and the spring constant of a vibrator to resonate. Accordingly, it is possible to reduce the size of the filter. For example, a resonator mechanically resonating in a 1-GHz band can be made not longer than several microns though the size of the resonator depends on its shape and resonant mode.

When the resonator is put in a vacuum state, the loss in kinetic energy caused by friction with the air when the vibrator is vibrating can be reduced. Accordingly to this manner, there is an effect that a Q value can be made as high as or higher than that of a conventional filter using electric resonance.

For example, an electromechanical filter disclosed in Non-Patent Document 1 has been known as a related-art electromechanical filter using a micro-vibrator.

The electromechanical filter in this Non-Patent Document 1 is constituted by two minute dual-supported beams and lines disposed just under the two dual-supported beams through a slight gap and for inputting and outputting a high frequency signal. The two dual-supported beams are minute beams coupled with each other. The two dual-supported beams are coupled mechanically. When a high frequency signal is input to this input line, the first vibrator is excited by an electrostatic force belonging to the high frequency signal itself. In this event, when the natural frequency of the dual-supported beam coincides with the frequency of the high frequency signal, the dual-supported beam is excited strongly in a direction perpendicular to a substrate so as to begin to vibrate. Since the dual-supported beam vibrates at its natural frequency, the electrostatic capacity, that is, the impedance changes. When a DC voltage is applied, an electric current flows in accordance with the change of the impedance. In such a manner, only when the natural frequency of the vibrator coincides with the frequency of the high frequency signal, the high frequency signal is output. Thus, only a desired signal can be selected.

There has been also proposed a vibrator using a minute structure (Non-Patent Document 2). As the minute structure, multiwalled carbon nanotubes are used. The minute structure is constituted by an electrode for inputting a signal, a carbon nanotube serving as an outer shell whose opposite ends are open, and a carbon nanotube serving as an inner shell. No frictional force acts between the outer and inner shell carbon nanotubes. Accordingly, once the inner shell carbon nanotube vibrates, energy will be exchanged between the kinetic energy of the inner shell carbon nanotube and Van der Waals potential, resulting in simple harmonic motion. The vibrating direction is the longitudinal direction of the carbon nanotubes. Non-Patent Document 1: Hight Q Microelectromechanical Filters, Frank D. Bannon, IEEE Journal of solid-state circuit, Vol. 35, No. 4, April 2000

Non-Patent Document 2: Multiwalled Carbon Nanotubes as Gigaherz Oscillators, Quanshui, Physical Letters Vol/88, Number 4, 28 Jan. 2002

DISCLOSURE OF THE INVENTION

Problems that the Invention is to Solve

However, any vibrator generally has some resonant modes such as longitudinal vibration, transverse vibration, torsional vibration, etc. Accordingly, the vibrator may vibrate at undesired frequencies if they are excited. In the aforementioned example, a primary mode of a transverse vibration mode of a vibrator is used. Not to say, when a signal with a frequency equal to the natural frequency in a longitudinal vibration mode is input, the vibrator vibrates longitudinally so that a high frequency signal with a frequency equal to the natural frequency in the longitudinal vibration mode is output from the filter. Thus, there is a problem that an undesired signal may be also output from the filter.

Figure 16:
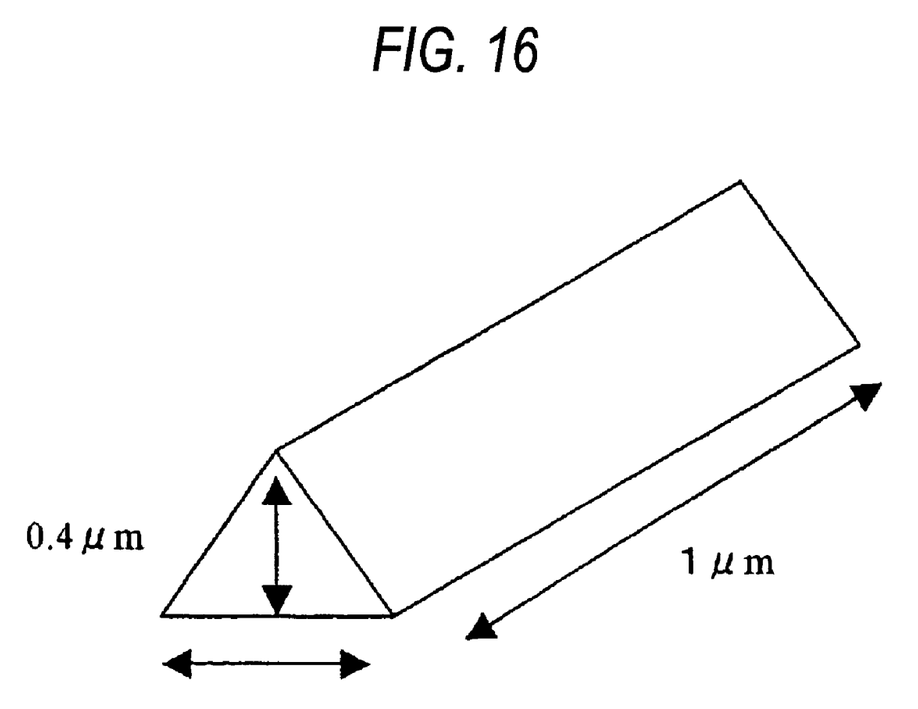
[FIG. 16] A view showing an example of a related-art electromechanical filter.

For example, description will be made on a triangular-prism resonator having a natural frequency in a 1-GHz band as shown in FIG. 16. Here, assume that the material of the resonator is silicon, the length thereof is 1 µm, the width thereof is 0.566 µm, and the thickness thereof is 0.4 µm. Table 1 shows modes generated in this resonator in these conditions. In this case, the Young's modulus is set at 169 GPa, and the density is set at 2.5 kg/m$^3$.

TABLE 1

Mode Table

| No. | Mode | Resonant Frequency |
| --- | --- | --- |
| 1 | Vertical primary | 709.8 MHz |
| 2 | horizontal primary | 813.7 MHz |
| 3 | Torsional primary | 1.12 GHz |
| 4 | Vertical secondary | 1.64 GHz |
| 5 | Horizontal secondary | 1.81 GHz |
| 6 | torsional secondary | 2.26 GHz |

Here, there are six modes between 700 MHz and 2.26 MHz. These frequency bands are frequency bands which are comparatively often used in wireless communication systems. Therefore, if a desired signal band were 1.12 GHz, the vibrator would be excited in response to an input signal corresponding to any one of the other five modes whose resonance frequency should be frequency bands to be suppressed essentially. Thus, there would arise a problem that an undesired signal might be not suppressed but output from the filter.

Further, resonation is performed in a 40 MHz band in the related-art example. However, when the structure in the related-art example is scaled directly to a GHz band, it is necessary to set the size of the vibrator to be about 1 µm and the gap between the input/output line and the vibrator to be about several tens of nanometers. There is a problem that it is difficult to obtain such a narrow gap between the vibrator and the line accurately and stably.

The present invention was developed in consideration of the foregoing situation. It is an object of the present invention to provide an electromechanical filter which can define a vibration mode so that a vibrator can be excited only in a desired vibration mode, that is, a filter which can suppress any vibration mode other than a desired vibration mode.

Means for Solving the Problems

An electromechanical filter according to the present invention is characterized by including: a first member for inputting a signal; a second member disposed at a predetermined distance from the first member so as to surround the first member and to be excited due to an electrostatic force caused by the signal input from the first member; and a third member disposed at a predetermined distance from the second member so as to surround the second member and to detect vibration of the second member; wherein: the second member receives an attractive force from the first member and the third member so as to be bound and regulated to generate vibration in a rotation direction; the first to third members are conductors, and each of the second and third members has portions differing in permittivity circumferentially; and signal transfer can be performed in accordance with a change in electrostatic capacity between the second and third members.

With this configuration, the second member is strongly excited so as to vibrate only when a signal with a predetermined frequency is input to the first member. Thus, the electrostatic capacity between the second member and the third member changes. In this event, when a DC voltage has been applied to the second member or the third member, the electrostatic capacity changes in accordance with the natural frequency of the second member so that the impedance changes. Thus, an electric current whose value corresponds to this change of the electrostatic capacity is output from the third member. That is, only a high frequency signal whose frequency coincides with the natural frequency of the second member can be output selectively.

In this configuration, the predetermined distance is set as a distance small enough to attract the members to each other due to an electrostatic force.

The electromechanical filter according to the present invention includes an electromechanical filter according to the aforementioned configuration, in which the second member is bound strongly enough to suppress vibration in any direction but one direction, that is, to obtain a high electrostatic capacity between the second member and the third member.

With this configuration, the vibration mode of the second member can be defined easily. Accordingly, the second member vibrates in only one direction while vibration in any other mode can be suppressed. It is therefore possible to output only a desired signal.

The electromechanical filter according to the present invention includes an electromechanical filter according to the aforementioned configuration, in which members formed by self-organization effect, including carbon nanotubes, carbon nanohorns and fullerenes, are used as the first member, the second member and the third member.

With this configuration, the distance between the first member and the second member and the distance between the second member and the third member are produced by self-organization. Accordingly, the members can be formed stably at the predetermined distances from one another when they are made microscopic.

Further, a Van der Waals force strongly acts on between the first member and the second member and between the second member and the third member. Accordingly, the second member is always bound due to attraction from either side. It is therefore possible to suppress any radial vibration mode of the second member.

The electromechanical filter according to the present invention includes an electromechanical filter according to the aforementioned configuration, in which torsional vibration is used as the vibration mode of the second member.

With this configuration, any radial vibration mode of the second member is strongly suppressed. Thus, only torsional vibration is excited easily. When the second member is twisted, the electrostatic capacity generated between an electrode formed in the second member and an electrode formed in the third member changes so that the vibration of the second member can be detected. In addition, since the vibration of the second member is not bound in the torsional direction, the Q value of the filter can be increased.

The electromechanical filter according to the present invention includes an electromechanical filter having a configuration in which the physical property values or shapes of the second member and the third member are not uniform.

With this configuration, the electrostatic capacity formed between the second member and the third member changes when the second member or the third member is displaced relatively. Accordingly, when the torsional vibration of the second member is excited so that the second member is twisted, the electrostatic capacity between the second member and the third member changes so that the vibration of the second member can be detected.

The electromechanical filter according to the present invention is characterized in that the second member and the third member include regions having uneven shapes.

With this configuration, the electrostatic capacity formed between the second member and the third member changes when the second member and the third member are displaced relatively.

The regions having uneven shapes may be slits or holes.

The electromechanical filter according to the present invention includes an electromechanical filter in which the second and the third member have holes, slits or the like formed by lattice defects or by shaping.

The electromechanical filter according to the present invention includes an electromechanical filter in which the second member and the third member are shaped so that the electrostatic capacity becomes minimal when the displacement of the second member is zero, and the electrostatic capacity becomes maximal when the displacement of the second member is maximal.

With this configuration, the electrostatic capacity between the second member and the third member can change when the second member is displaced. Accordingly, the vibration of the second member can be detected so that only a signal with a desired frequency can be output.

The electromechanical filter according to the present invention includes an electromechanical filter in which: the first member comprises a conductive column serving as a signal line; the second member comprises a cylinder disposed at a predetermined distance from the first member so as to surround the first member; the third member comprises a cylinder disposed at a predetermined distance from the second member so as to surround the second member; and the first to third members are formed so that electrostatic capacity can change due to a change in relative position among the first to third members.

The electromechanical filter according to the present invention includes an electromechanical filter in which the first to third members have different lengths so that the first member is the longest and the third member is the shortest, and the first to third members are supported in their opposite ends.

The electromechanical filter according to the present invention includes an electromechanical filter in which the second and third members are conductive spheres rotatably supported in their opposite ends.

The electromechanical filter according to the present invention includes an electromechanical filter in which the second and third members are formed to have slits so that electrostatic capacity changes due to a change in relative position therebetween.

The electromechanical filter according to the present invention includes an electromechanical filter in which the second and third members are formed so that conductive regions and insulating regions are mixed in each of the second and third members.

The electromechanical filter according to the present invention includes an electromechanical filter in which the second and third members comprise insulating cylinders, and conductive patterns are formed in surfaces of the cylinders so as to face each other.

Effect of the Invention

As described above, according to the present invention, any vibration mode of a vibrator other than a predetermined vibration mode is suppressed without losing the Q value in the predetermined vibration mode. It is therefore possible to obtain a filter selectively outputting only a desired frequency.

DESCRIPTION OF REFERENCE NUMERALS

1: first member
2: second member
3: third member
100: carbon nanotube

Best Mode for Carrying Out the Invention

According to the present invention, in a filter using mechanical resonance phenomena, all the vibration modes of a vibrator but a predetermined vibration mode are suppressed so that the desired mode can be excited to selectively output only a predetermined signal.

Particularly, this embodiment uses a minute structure in which a second member 2 disposed to surround a first member 1 and a third member 3 disposed to further surround this second member 2 are covered with shell-like members composed of materials formed by self-organization including carbon nanotubes, carbon nanohorns and fullerenes as shown in FIGS. 1(a) and (b). The second member 2 is strongly attracted by the first member 1 and the third member 3 due to the Van der Waals force so that the second member 2 is strongly restrained from vibrating in any direction other than the rotation direction.

The second member 2 and the third member 3 are composed of conductors having slits S2 and S3 penetrating the members in the longitudinal directions of the members respectively. The second member 2 and the third member 3 are formed to have electrostatic capacity between the second member 2 and the third member 3. When a high frequency signal is input to the first member 1, the second member 2 is excited by the electrostatic force belonging to the high frequency signal itself.

In this event, when the frequency of the high frequency signal coincides with the natural frequency of torsional vibration of the second member 2, the second member 2 is excited largely. The second member 2 and the third member 3 have slits so that uniformity is not secured circumferentially between the second member 2 and the third member 3. Accordingly, when the second member 2 is twisted by vibration, the electrostatic capacity formed between the second member 2 and the third member 3 is changed. This electrostatic capacity changes due to vibration based on the natural frequency of the second member. Accordingly, when a DC voltage is applied to the second member 2 or the third member 3, a high frequency signal corresponding to the natural frequency is output from the third member 3.

It is therefore possible to selectively output only a signal with a predetermined frequency.

Generally, the resonance frequency f of a mechanical vibrator is expressed by the following (Expression 1) when l, E and ρ designate the length, the elastic modulus and the density of a structure respectively.

$$f = 1/l \sqrt{(E/\rho)} \quad (1)$$

Embodiments of the present invention will be described below in detail with reference to the drawings.

Embodiment 1

Figure 1:
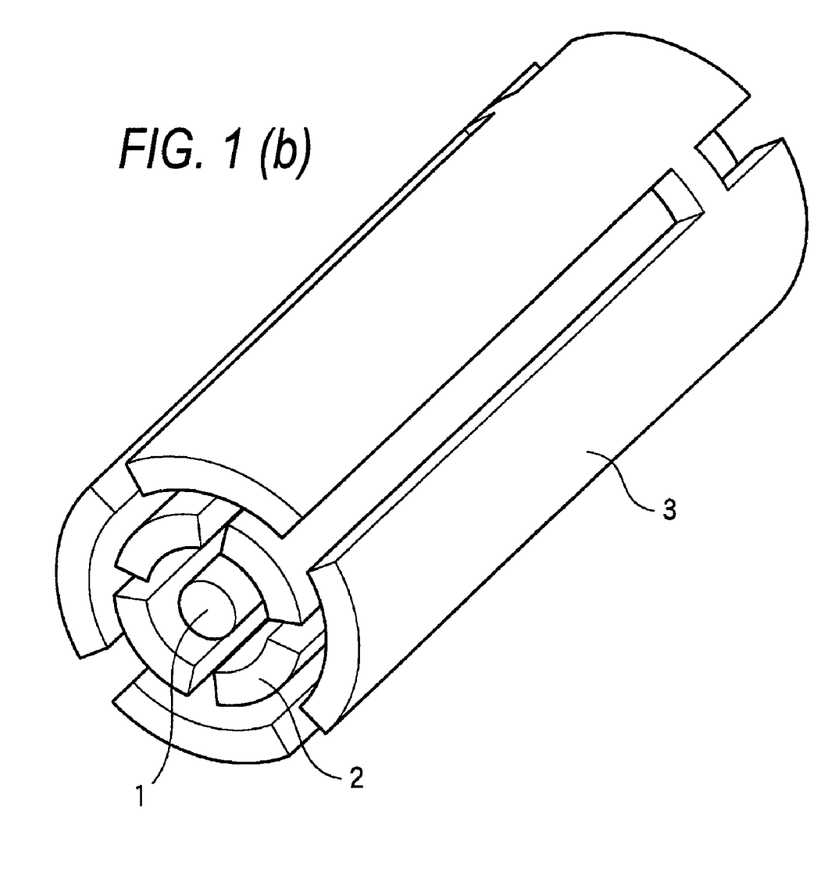
[FIG. 1] A schematic configuration view and a sectional view showing the configuration of a filter using a multilayer carbon nanotube according to Embodiment 1 of the present invention.

FIG. 1 are views showing the configuration of a filter according to this Embodiment 1. FIG. 1 are a schematic configuration view and a sectional view showing the configuration of an electromechanical filter using a three-layer carbon nanotube.

An electromechanical filter 100 according to this embodiment is constituted by a first member 1, a second member 2 and a third member 3 as shown in FIG. 1. The first member 1, the second member 2 and the third member 3 are formed out of an inner shell, an intermediate shell and an outer shell of carbon nanotubes respectively. The first member 1, the second member 2 and the third member 3 are formed by self-organization individually. The first member 1, the second member 2 and the third member 3 are fixedly connected and bound to a substrate (not shown) or the like in their opposite ends so that vibration in the longitudinal direction of the carbon nanotubes (hereinafter referred to as longitudinal vibration) is suppressed. The first member 1, the second member 2 and the third member 3 are connected to an input line, a DC power supply and an output line respectively. The DC power supply may be connected to the third member 3.

A gap between adjacent shells of the carbon nanotubes is so minute that the shells attract each other due to a strong Van der Waals force acting thereon. Accordingly, the second member 2 is attracted from the inside by the first member and attracted from the outside by the third member 3. Thus, the second member 2 is designed to hardly vibrate in the radial direction of the carbon nanotube (this vibration will be referred to as transverse vibration).

Since at least one end of the second member 2 is fixed, the second member 2 has little displacement in the longitudinal direction of the carbon nanotube. The second member 2 may be fixed at its opposite ends so that its longitudinal displacement is perfectly fixed. In either case, there is no fear that the second member 2 may vibrate longitudinally as in Non-Patent Document 2.

The members do not contact with one another, but are retained with a space from one another. Accordingly, no force to block motion in the rotation direction acts on each member, but the frictional force becomes extremely minute. Thus, the second member 2 is excited easily in a torsional vibration mode, but transverse vibration thereof can be strongly suppressed.

In order to detect vibration in a torsional direction, the second member 2 and the third member 3 are not composed of uniform carbon tubes, but formed out of carbon nanotubes in which insulators are formed partially or carbon nanotubes in which lattice defects or artificial slits or holes are formed in order to detect a change in relative position between the second member 2 and the third member 3.

Although four slits are disposed in the second member 2 and the third member 3 in FIG. 1 for the sake of simplification of description, in fact a larger number of slits maybe disposed. Not slits but holes may be disposed. It will go well if the second member and the third member are designed so that the overlapping area changes in accordance with a change in relative position between the second member and the third member.

Figure 2:
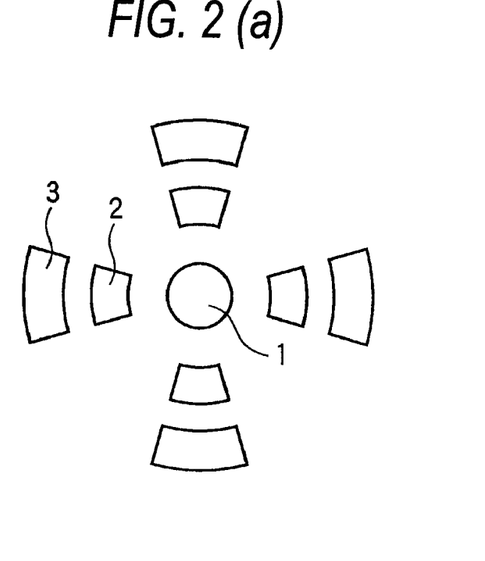
[FIG. 2] Views showing displacement states in Embodiment 1 of the present invention.

Next, a method for detecting vibration will be described. FIG. 2 show sectional views of the filter 100. Of the second member and the third member, only parts of their electrodes are illustrated for the sake of description. When the second member 2 is excited by an electrostatic force of a signal input to the first member 1 so that a torsional vibration mode is excited, the second member 2 is displaced in a torsional direction. Assume that FIG. 2(*a*) shows a minimum displacement state and FIG. 2(*b*) shows a maximum displacement state. The overlapping area between the second member 2 and the third member 3 changes between the minimum displacement state and the maximum displacement state so that the electrostatic capacity changes. The torsional vibration of the second member 2 can be detected based on this change of the electrostatic capacity.

In such a manner, the second member 2 vibrates with a natural frequency of the torsional vibration so that the electrostatic capacity formed between the second member 2 and the third member 3 changes. Due to this change, an electric current is output from the third member 3 in accordance with the change of the electrostatic capacity corresponding to the natural frequency when a DC voltage is applied to the second member or the third member 3.

That is, only when a signal whose frequency coincides with the natural frequency of the torsional mode of the second member 2 is input to the first member 1, the second member 2 is excited so that a signal is output from the third member 3. In this event, any other mode is not excited.

When the second member has a cylindrical shape as shown in FIGS. 1, the natural frequency f of the torsional mode is expressed by Expression 1. Here, l, G and ρ designate the length of the second member, the transverse elastic modulus and the density of the second member respectively. It can be noted here that the natural frequency f depends on the material constant and the length of the second member 2.

Here, when the transverse elastic modulus of the carbon nanotube is 1 GPa, ρ is 1.33 g/cc and l is 200 nm, the resonance frequency is 1.3 GHz.

When the vibrator is made finer, the opposed area between the vibrator and each input/output electrode becomes smaller. Accordingly, the electrostatic capacity between the vibrator and the input/output electrode becomes smaller. Therefore, the input/output impedance becomes so high that impedance matching with another device becomes difficult.

In order to increase the electrostatic capacity, there is a method of reducing the gap between electrodes or increasing the opposed area between the electrodes. According to the present invention, the gap between the electrodes can be formed microscopically and stably. The gap size is about $3\text{-}4\times10^{-1}$ nm (several angstroms) to several tens of nanometers.

When the diameter r of the first member is increased, the electrostatic capacity can be increased because the area opposed to the second member is defined by the circumference 2πr.

When the structure according to this embodiment is used thus, it is easy to reduce the impedance.

Although an outer shell 108 is formed out of a carbon nanotube similar to those of an inner shell 106 and a core 104 in the filter 100, the outer shell 108 is not limited to this. Another material having self-organizing power may be used.

The second member does not have to be single. In order to secure a broad pass band in the filter, a plurality of resonators as shown in FIG. 1 may be coupled longitudinally.

Figure 13:
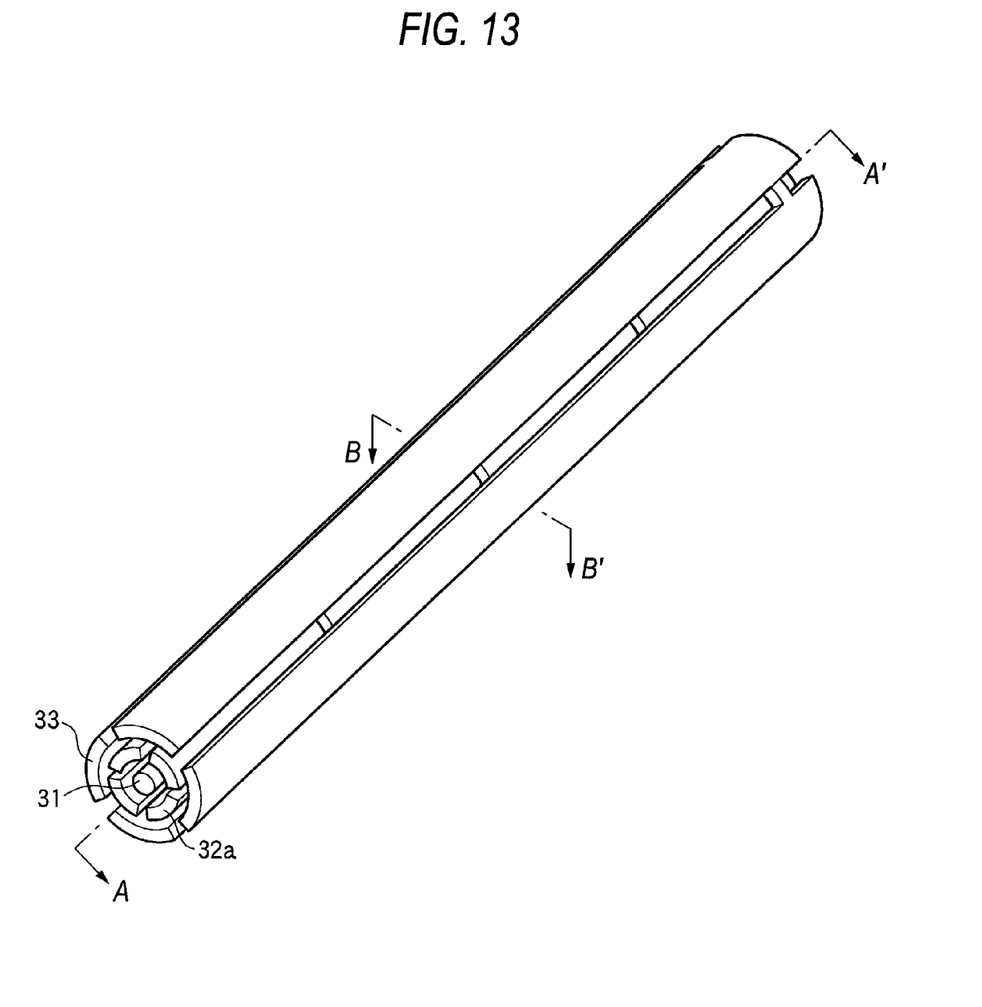
[FIG. 13] A perspective view of an electric filter in which a plurality of filters according to Embodiment 1 of the present invention are coupled.
Figure 14:
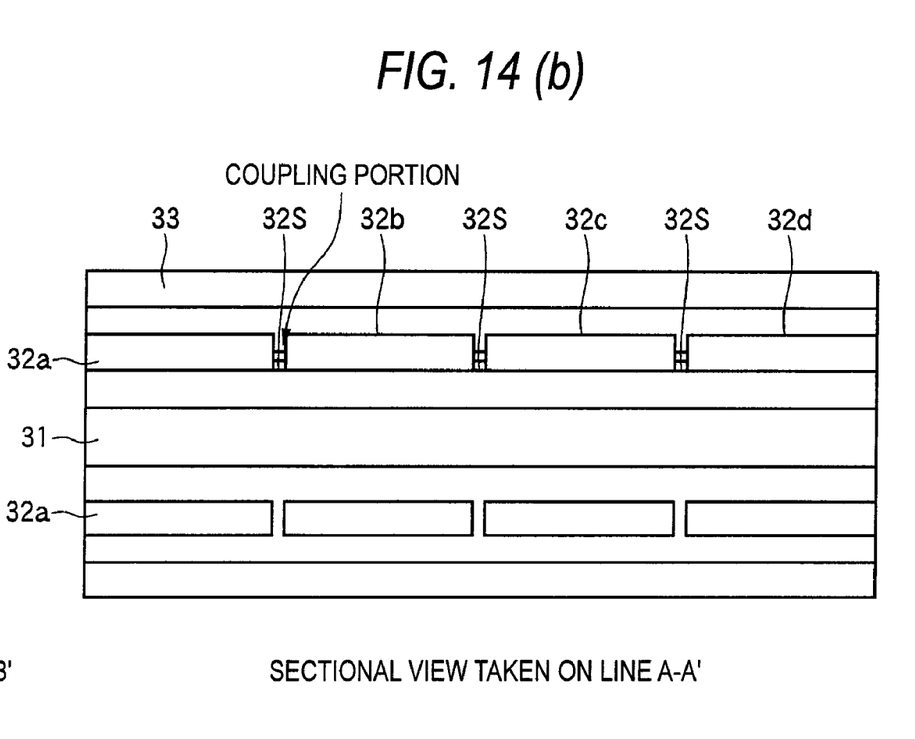
[FIG. 14] Sectional views showing the electric filter in which a plurality of filters according to Embodiment 1 of the present invention are coupled, by way of example.

FIG. 13 and FIGS. 14(*a*) and (*b*) show schematic configuration views in which four second members are coupled. In this embodiment, four second members 32*a*, 32*b*, 32*c* and 32*d* having one and the same resonance frequency are coupled longitudinally through minute coupling portions 32*s*. Other portions are formed in the same manner as in the aforementioned Embodiment 1.

Figure 15:
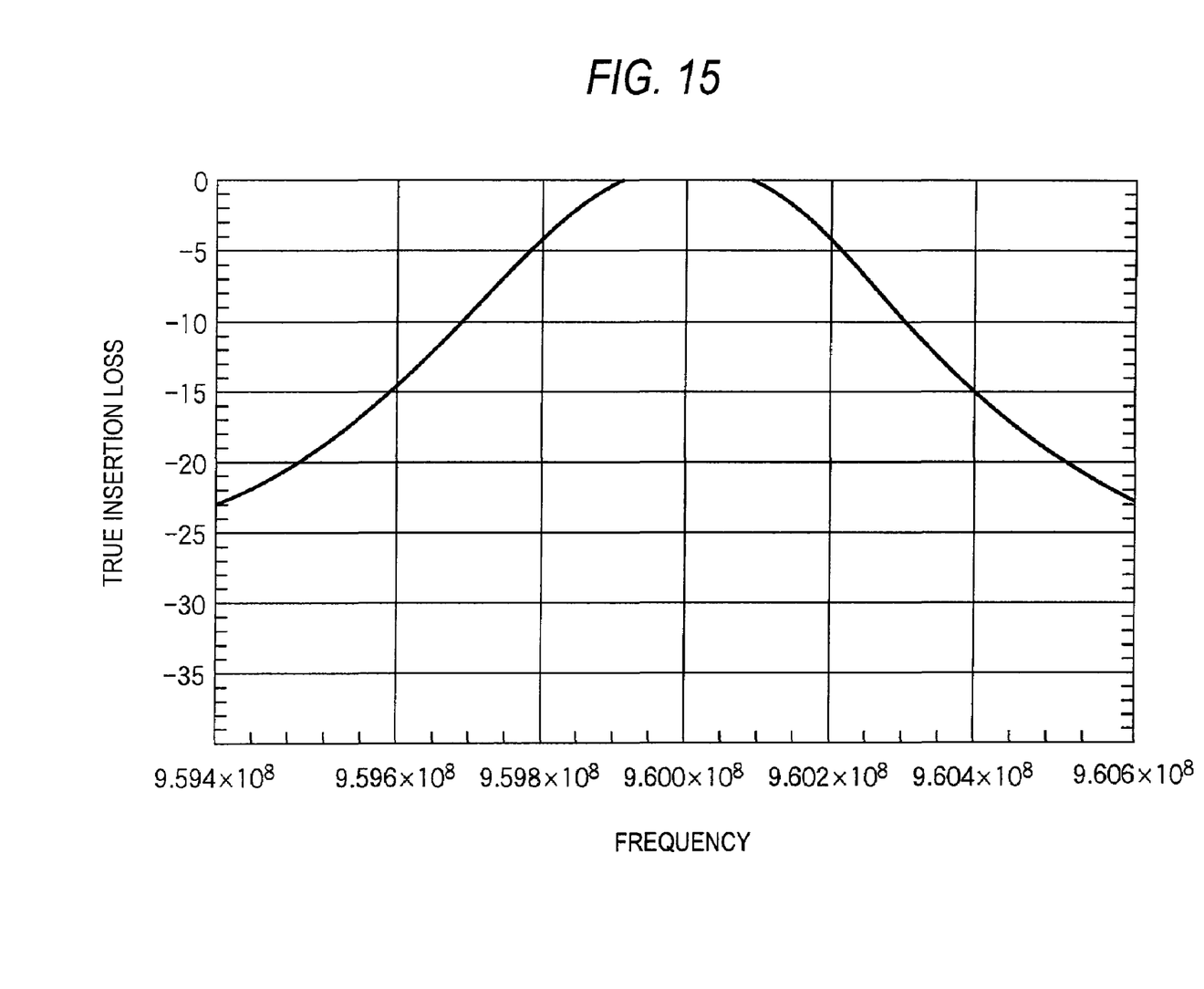
[FIG. 15] A graph showing an example of the output characteristic of the electric filter shown in FIGS. 13 and 14.

FIG. 15 is a graph showing an example of an output signal when a plurality of resonators shown in FIG. 1 were coupled longitudinally.

The ordinate designates the true insertion loss, and the abscissa designates the frequency. For example, a broad band characteristic around a center frequency of $9.600\times10^8$ Hz could be obtained.

When a plurality of resonators are coupled, a plurality of resonators having one and the same frequency may be coupled. However, resonators having different frequencies may be coupled.

Next, a method for manufacturing the electromechanical filter according to the embodiment will be described.

Figure 3:
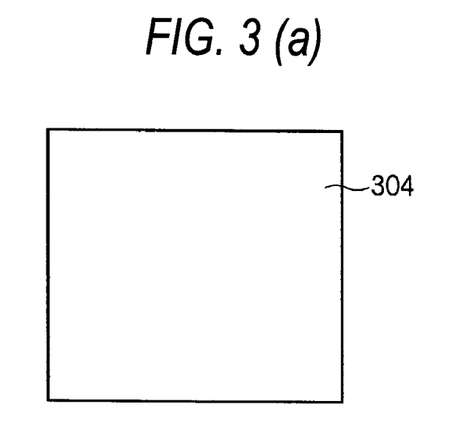
[FIG. 3] A sectional view and a top view for stepwise explaining a process for manufacturing the filter according to Embodiment 1 of the present invention.
Figure 4:
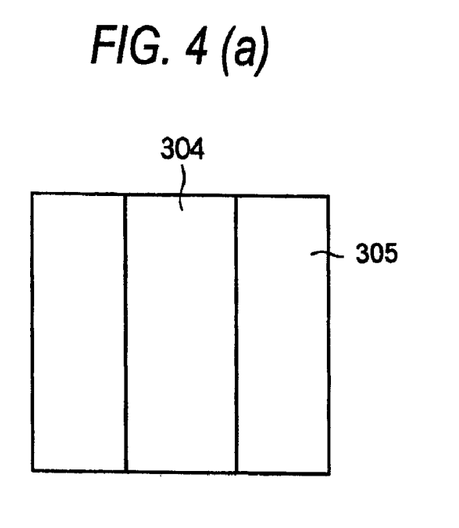
[FIG. 4] A sectional view and a top view for stepwise explaining the process for manufacturing the filter according to Embodiment 1 of the present invention.
Figure 5:
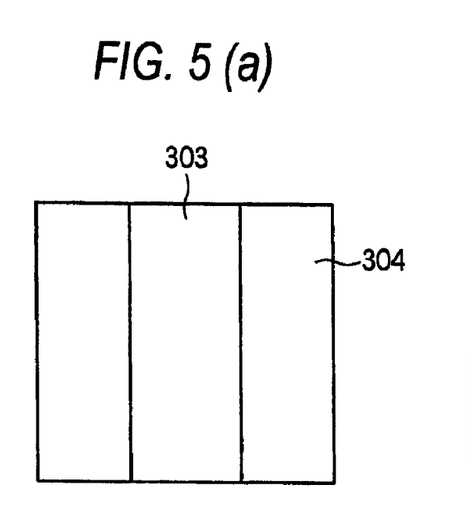
[FIG. 5] A sectional view and a top view for stepwise explaining the process for manufacturing the filter according to Embodiment 1 of the present invention.
Figure 6:
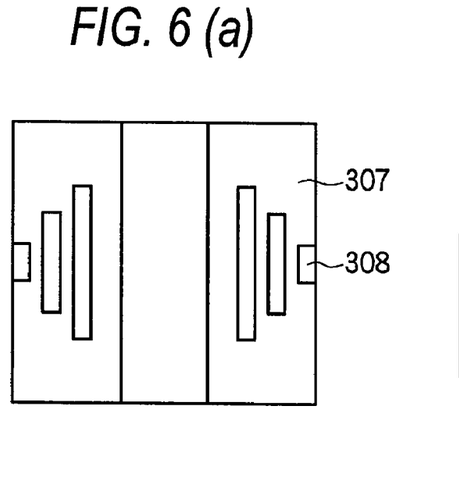
[FIG. 6] A sectional view and a top view for stepwise explaining the process for manufacturing the filter according to Embodiment 1 of the present invention.
Figure 7:
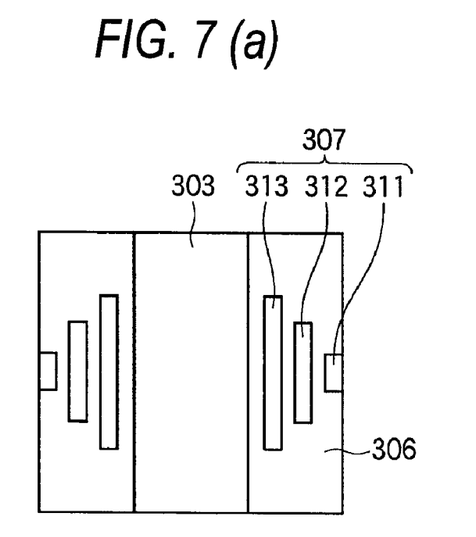
[FIG. 7] A sectional view and a top view for stepwise explaining the process for manufacturing the filter according to Embodiment 1 of the present invention.
Figure 8:
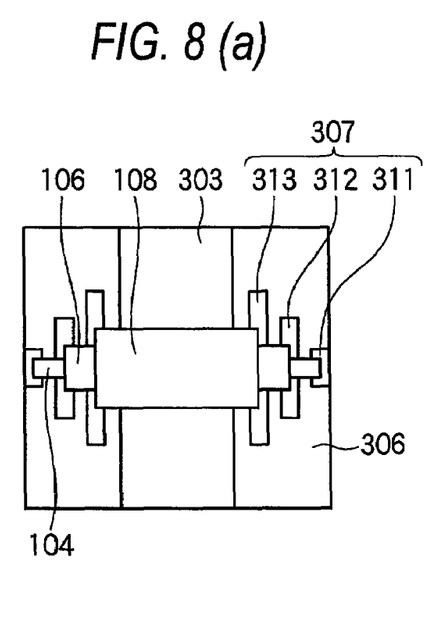
[FIG. 8] A sectional view and a top view for stepwise explaining the process for manufacturing the filter according to Embodiment 1 of the present invention.

FIGS. 3(a) and (b) to FIGS. 8(a) and (b) are sectional views for stepwise explaining a process for manufacturing an electromechanical filter according to the present invention. In each of FIGS. 3 to 8, (a) is a top view and (b) is a sectional view taken on line A-A.

First, as shown in FIGS. 3(a) and (b), silicon oxide serving as an insulating film 303 is formed to be about 1 μm thick on a substrate 302 by thermal oxidation. Silicon nitride serving as a spacer portion 304 about 1 μm thick is formed further thereon by sputtering.

Next, as shown in FIGS. 4(a) and (b), a photo-resist 305 is formed and patterned on the silicon nitride film 304.

Next, as shown in FIGS. 5(a) and (b), the silicon nitride 304 is dry-etched with the photo-resist 305 as a mask, so as to form the spacer portion 304. After that, the photo-resist 305 is removed by ashing.

Then, a metal material 307 such as Fe, Co, Ni or the like serving as a catalyst in the growth of carbon nanotubes is deposited by sputtering to be about several tens of nanometers thick.

When the carbon nanotubes are not generated directly, metal such as Au, Al, Cu or the like is sputtered for forming line patterns.

In this embodiment, description will be described on the case where the carbon nanotubes are mounted in a post-process. It is therefore assumed that the metal material 307 forms line patterns. As shown in FIGS. 6(a) and (b), a resist 308 is applied, and line patterns are then formed by photo-lithography.

As shown in FIGS. 7(a) and (b), the metal material 307 is etched with the photo-resist as a mask, so as to form first to third lines 311, 312 and 313.

As shown in FIGS. 8(a) and (b), carbon nanotubes formed in advance are mounted on the line patterns. In this event, the first member 1, the second member 2 and the third member 3 are electrically connected to the line pattern 311, the line pattern 312 and the line pattern 313 respectively. These connections between the line patterns and the first to third members are performed through conductive adhesive such as solder balls 314 or the like.

The carbon nanotubes may be grown to bridge the respective lines.

As the method for forming the carbon nanotubes, many attempts have been already made. For example, there have been disclosed a method of vapor grown carbon fiber, a method of arc discharge in helium gas, etc.

The first member 1, the second member 2 and the third member 3 are formed in advance so that the distance between the opposite ends of the carbon nanotube of the first member 1 is the longest, and that of the second member 2 and that of the third member 3 become shorter by degrees. This can be realized by removing the opposite ends of each member with a laser or electron beam or the like. There are other methods such as a method for bringing each leading end into contact with reactive gas to thereby selectively etch the leading end, a method for applying a high voltage to a leading end of each carbon nanotube to thereby generate corona discharge and destroy the leading end, a method for bringing each leading end into contact with highly reactive fluid to thereby etch the leading end, and so on.

In order to make the conductivity in the second member 2 and the third member 3 nonuniform (not uniform), holes, slits and so on can be formed by a laser or electron beam or the like.

Also in this case, the second and third members may be brought into contact with reactive gas, corona discharge or highly reactive fluid so as to be provided with slits, holes or the like. Thus, the conductivity in the second and third members can be made nonuniform (not uniform).

When carbon nanotubes having defects produced in advance are used, the conductivity in the second and third members can be made nonuniform (not uniform) without being provided with holes or slits.

Next, description will be made on the operation of this electromechanical filter.

In this electromechanical filter, when a high frequency signal is not input to the first member, the second member is not excited. Accordingly, the second member remains stationary without torsional vibration. Regard this state as an initial state.

Now, when the second member and the third member in the initial state are formed so that their holes do not overlap each other in the initial state, each of the opposed surfaces of the second member and the third member to each other has no other surface to be opposed. Accordingly, the electrostatic capacity becomes minimal. Next, as illustrated, assume that the region extracted for the sake of description is changed uniformly in the illustrated upward transverse direction due to torsional vibration. In this case, the holes of the second member and the holes of the third member overlap each other. Accordingly, the electrostatic capacity becomes maximal.

When only excitation at the natural frequency is taken into consideration, the initial state is not significant. However, if the capacity is maximal in the initial state, the impedance will be small for an input signal in spite of absence of excitation. Thus, an undesired signal will be transferred. It is therefore desired that the capacity is made minimal in the initial state.

The initial state is set as follows.

First, the third member and the second member are twisted relatively by half a pitch (so as to minimize the capacity). While that state is kept, the second and third members are shaped concurrently by a laser, an FIB or the like so that slits or holes are formed. After the shaping, the external force such as torsion is released so that the second and third members are restored to their original states. Thus, the capacity becomes minimal in the initial state.

Alternatively, before the second and third members are fixed, the second and third members are changed relatively while the capacity value is monitored. The second and third members are fixed to where the capacity value is minimal. This is set as the initial state.

This pitch of holes may be determined in accordance with the expected maximum displacement of the second member 2.

It is desired that the hole diameter is prevented from losing the Van der Waals force of the second or third member. When the hole-to-member area ratio is 1 to 1, the electrostatic capacity change ratio is maximized. This has a trade-off relation to the Van der Waals force. Thus, the electrostatic capacity change ratio may be optimized in accordance with the carbon nanotube size.

According to this embodiment, it is possible to form a small-size and high-precision electromechanical filter easily.

Although a vibrator is formed using a carbon nanotube in the aforementioned embodiment, a vibrator may be formed in a usual semiconductor process using film formation such as CVD, sputtering or the like, photo-lithography, and etching. In this case, a vibrator is formed in a direction perpendicular to the main surface of a substrate in the steps of film formation, photo-lithography, formation of through holes using reactive ion etching, charging the through holes with doped polysilicon, outer wall oxidation based on thermal oxidation, and so on. Finally, unnecessary portions are removed by etching so that support connection portions are left in the opposite ends. The vibrator is turned by 90 degrees in use. Thus, the vibrator can be formed by a combination of usual MEMS techniques.

Embodiment 2

Figure 9:
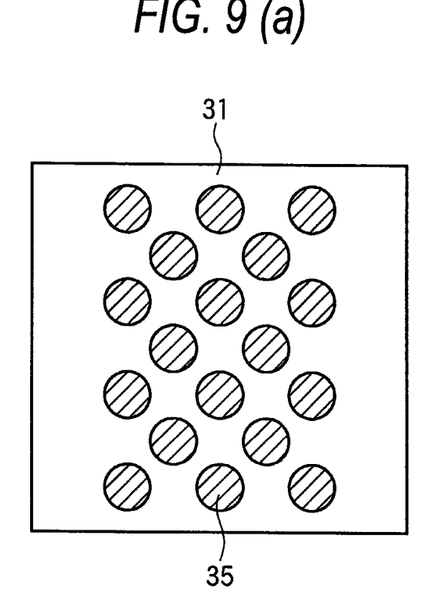
[FIG. 9] Top views for explaining surface states of a filter according to Embodiment 2 of the present invention.
Figure 10:
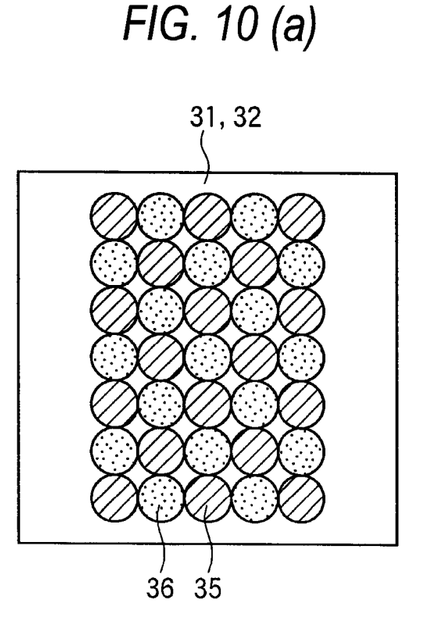
[FIG. 10] Views showing displacement states in Embodiment 2 of the present invention.

Embodiment 2 of the present invention will be described with reference to FIGS. 9 and 10.

Description will be omitted as to similar portions of this Embodiment 2 to those of Embodiment 1, such as principles of operation of a filter, a method for manufacturing the filter, and so on.

In FIGS. 9(a) and (b), surfaces of cylinders forming the second member 2 and the third member 3 shown in Embodiment 1 are developed in a plane for convenience of description. However, the regions developed in this plane are not always obtained from development of the whole surfaces of the members 2 and 3. The regions are obtained by extraction of parts of them for convenience of description.

The reference numerals 31 and 32 correspond to the second member 2 and the third member 3 respectively. Minute holes 35 and 36 are formed in the second member 31 and the third member 32. These holes may be formed by controlling defects or worked by a laser or electron beam or the like.

These holes are provided for making the conductivity in the surfaces of the second member and the third member nonuniform (not uniform) spatially. If the second member 2 and/or the third member 3 is formed of a uniform conductor, the electrostatic capacity generated between the second member 2 and the third member 3 will not change even when the second member 2 is twisted to change the relative position between the second member 2 and the third member 3. Therefore, if the spatial conductivity between the second member 2 and the third member 3 is made uneven spatially and nonuniform, the electrostatic capacity will change when the second member 2 and the third member 3 are displaced relatively.

FIGS. 10(a) and (b) show the initial state and the maximum displacement state. The holes do not overlap each other in the initial state, while all the holes overlap each other in the maximum displacement state so that the electrostatic capacity is maximized. When this change of the electrostatic capacity is extracted as an output current, it is possible to form an electromechanical filter.

Thus, a microscopic electromechanical filter can be formed.

Embodiment 3

Figure 11:
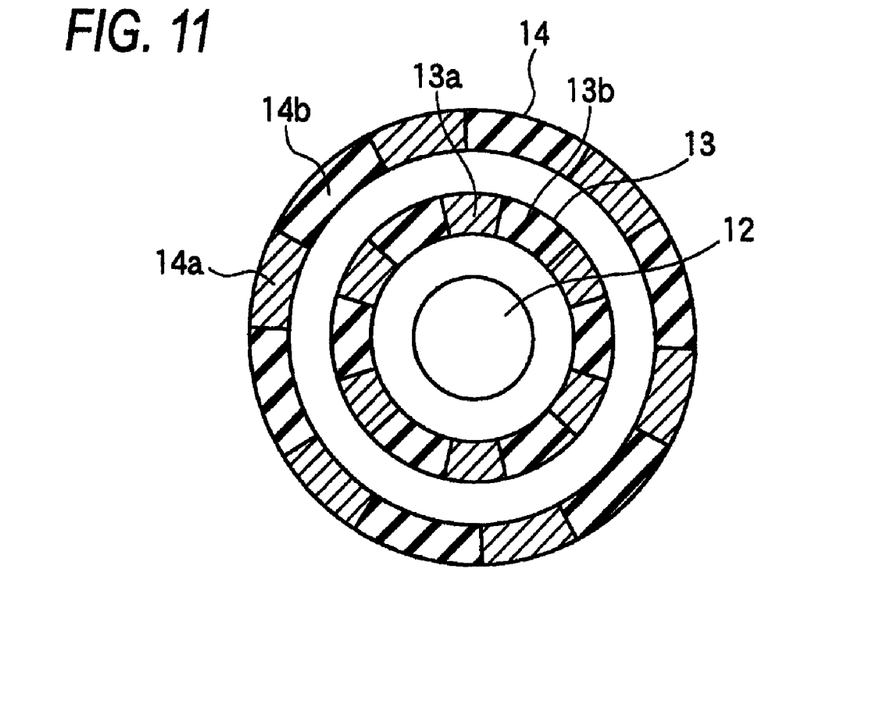
[FIG. 11] A sectional view showing a filter according to Embodiment 3 of the present invention.

FIG. 11 shows an electromechanical filter according to Embodiment 3 of the present invention.

In the same manner as in Embodiment 2, principles of operation of a filter, a method for manufacturing the filter, and soon, are similar to those in Embodiment 1, and description about the similar portions will be omitted.

FIG. 11 is a schematic sectional view of an electromechanical filter according to Embodiment 3 of the present invention.

In this embodiment, a second member 12 made of a cylinder formed around a first member 11 so as to surround the first member 11 at a predetermined distance therefrom and a third member 13 formed further outside this second member so as to surround the second member at a predetermined distance therefrom are formed. The electromechanical filter is formed in the same as those in the aforementioned embodiments, except that the second and third members 12 and 13 are constituted by conductive regions 12a, insulating regions 12b, conductive regions 13a and insulating regions 13b respectively. Here, it is assumed that the conductive regions are electrically connected to one another in each of the second and third members.

According to this configuration, when a signal with a predetermined frequency is input to the first member 1, the second member is excited so that the electrostatic capacity between the second member 12 and the third member 13 changes due to the change in relative position between the second member and the third member. Here, when a DC voltage is applied to the second member 12 or the third member 13, a current corresponding to the frequency of the natural vibration is output due to this change in electrostatic capacity. The torsional vibration of the second member 12 can be detected based on this current value.

Embodiment 4

Figure 12:
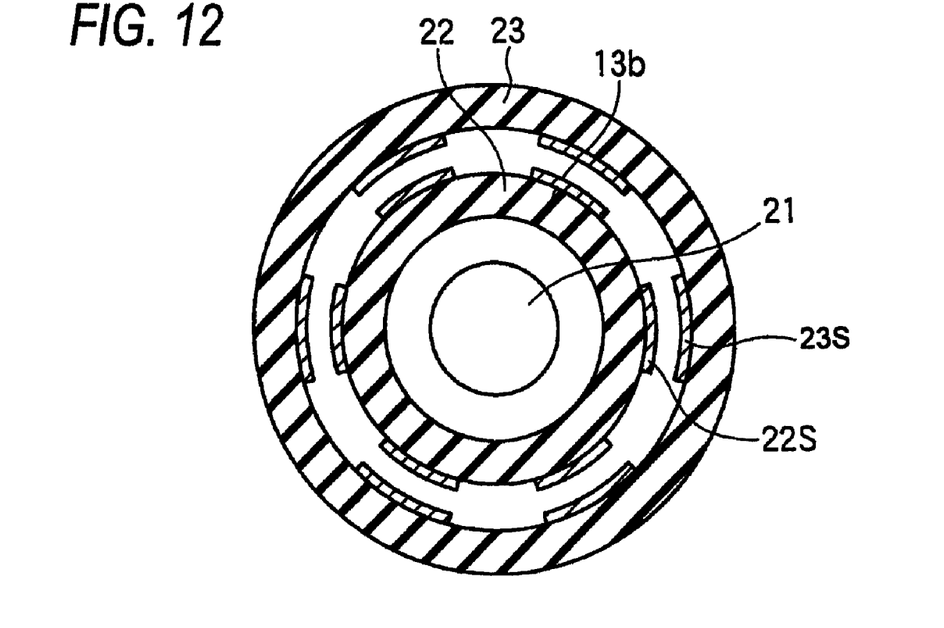
[FIG. 12] A sectional view showing a filter according to Embodiment 4 of the present invention.

FIG. 12 shows an electromechanical filter according to Embodiment 4 of the present invention.

In the same manner as in Embodiment 3, principles of operation of a filter, a method for manufacturing the filter, and soon, are similar to those in Embodiment 1, and description about the similar portions will be omitted.

FIG. 12 is a schematic sectional view of an electromechanical filter according to Embodiment 4 of the present invention.

This embodiment is characterized in that a second member 22 and a third member 23 are composed of an insulating material, and conductive patterns 22S and 23S are formed in the opposed surfaces of the second and third members 22 and 23 respectively. The other portions are formed in the same manner as those in the aforementioned Embodiment 3. Here, it is assumed that the conductive patterns are electrically connected to one another in each of the second and third members.

This embodiment results in the same thing as when slits are formed in the conductive members. Due to the shapes of the conductive patterns 22S and 23S, the electrostatic capacity between the second member 22 and the third member 23 changes in accordance with a change in relative position between the second member and the third member. Here, when a DC voltage is applied to the conductive patterns 22S or 23S of the second member 22 or the third member 23, a current corresponding to the frequency of the natural vibration is output due to this change in electrostatic capacity. The torsional vibration of the second member 22 can be detected based on this current value.

Although a carbon nanotube is used as the vibrator in the aforementioned embodiment, the present invention is not limited to this. The present invention can be attained easily by MEMS technology using materials selected suitably.

INDUSTRIAL APPLICABILITY

An electromechanical filter according to the present invention suppresses any vibration mode other than a predetermined vibration mode without losing the Q value in the predetermined vibration mode. It is therefore possible to obtain a filter which can selectively output only a predetermined frequency. The present invention is useful for an electromechanical filter with a micro-vibrator. Passive parts on a high frequency circuit can be miniaturized. Thus, it is possible to realize advanced communication apparatus supporting higher service frequency bands and miniaturization of terminals for high electrostatic capacity and high speed communications.

The invention claimed is:

1. An electromechanical filter comprising:
a first member for inputting a signal;
a second member disposed at a predetermined distance from the first member so as to surround the first member and to be excited due to an electrostatic force caused by the signal input from the first member; and
a third member disposed at a predetermined distance from the second member so as to surround the second member and to detect vibration of the second member,
wherein the second member receives an attractive force from the first member and the third member so as to be bound and regulated to generate vibration in a rotation direction,
wherein the first to third members are conductors, and each of the second and third members has portions differing in permittivity circumferentially, and
wherein signal transfer is performed in accordance with a change in electrostatic capacity between the second and third members.

2. The electromechanical filter according to claim 1, wherein a vibration mode of the second member is a torsional vibration mode.

3. The electromechanical filter according to claim 1, wherein a force to suppress vibration of the second member is a Van der Waals force.

4. The electromechanical filter according to claim 1, wherein, of the first to third members, at least the second member comprises a material to be formed by self-organization, and the predetermined distance is a narrow gap at least formed by the self-organization of the first member.

5. The electromechanical filter according to claim 4, wherein the material to be formed by self-organization is a carbon nanotube.

6. The electromechanical filter according to claim 1, wherein the second member and the third member include regions having uneven physical property values.

7. The electromechanical filter according to claim 1, wherein the second member and the third member include regions having uneven shapes.

8. The electromechanical filter according to claim 7, wherein the regions having uneven shapes comprise slits or holes.

9. The electromechanical filter according to claim 1, wherein the first member comprises a conductive column serving as a signal line,
wherein the second member comprises a cylinder disposed at a predetermined distance from the first member so as to surround the first member,
wherein the third member comprises a cylinder disposed at a predetermined distance from the second member so as to surround the second member, and
wherein the first to third members are formed so that electrostatic capacity can change due to a change in relative position among the first to third members.

10. The electromechanical filter according to claim 9, wherein the first to third members have different lengths so that the first member is the longest and the third member is the shortest, and the first to third members are supported in their opposite ends.

11. The electromechanical filter according to claim 10, wherein the second and third members comprise conductive spheres rotatably supported in their opposite ends.

12. The electromechanical filter according to claim 9, wherein the second and third members are formed to have slits so that electrostatic capacity changes due to a change in relative position therebetween.

13. The electromechanical filter according to claim 9, wherein the second and third members are formed so that conductive regions and insulating regions are mixed in each of the second and third members.

14. The electromechanical filter according to claim 9, wherein the second and third members comprise insulating cylinders, and conductive pattern are formed in surface of the cylinders so as to face each other.

* * * * *

UNITED STATES PATENT AND TRADEMARK OFFICE
CERTIFICATE OF CORRECTION

| | |
|---|---|
| PATENT NO. | : 7,439,823 B2 |
| APPLICATION NO. | : 11/569501 |
| DATED | : October 21, 2008 |
| INVENTOR(S) | : Yoshito Nakanishi et al. |

It is certified that error appears in the above-identified patent and that said Letters Patent is hereby corrected as shown below:

In column 11, line 29, please delete "maybe" and insert therefor -- may be --.

In column 11, line 59, please delete "soon" and insert therefor -- so on --.

In column 12, line 27, please delete "soon" and insert therefor -- so on --.

Signed and Sealed this

Twenty-fourth Day of March, 2009

JOHN DOLL
*Acting Director of the United States Patent and Trademark Office*